(12) United States Patent
McAdams et al.

(10) Patent No.: US 6,952,623 B2
(45) Date of Patent: Oct. 4, 2005

(54) PERMANENT CHIP ID USING FERAM

(75) Inventors: Hugh P. McAdams, McKinney, TX (US); James W. Grace, Los Altos Hills, CA (US); Ralph H. Lanham, Cupertino, CA (US)

(73) Assignees: Texas Instruments, Inc., Dallas, TX (US); Agilent Technologies, Inc., Palo Alto, CA (US)

( * ) Notice: Subject to any disclaimer, the term of this patent is extended or adjusted under 35 U.S.C. 154(b) by 61 days.

(21) Appl. No.: 10/190,408

(22) Filed: Jul. 2, 2002

(65) Prior Publication Data

US 2004/0006404 A1 Jan. 8, 2004

(51) Int. Cl.$^7$ .................. G06F 19/00; G11C 11/22
(52) U.S. Cl. ............... 700/115; 700/121; 365/145
(58) Field of Search ............................. 700/115, 116, 700/121; 702/117, 120; 365/145, 201

(56) References Cited

U.S. PATENT DOCUMENTS

| | | | | | |
|---|---|---|---|---|---|
| 5,254,482 A | * | 10/1993 | Fisch | ..................... | 438/3 |
| 5,764,655 A | * | 6/1998 | Kirihata et al. | ............. | 714/733 |
| 5,856,923 A | * | 1/1999 | Jones et al. | .................. | 700/121 |
| 5,862,151 A | * | 1/1999 | Fagerness | ................... | 714/733 |
| 5,907,492 A | * | 5/1999 | Akram et al. | ............... | 700/121 |
| 6,067,262 A | * | 5/2000 | Irrinki et al. | ............... | 365/201 |
| 6,067,507 A | * | 5/2000 | Beffa | ........................ | 702/118 |
| 6,085,334 A | * | 7/2000 | Giles et al. | ..................... | 714/7 |
| 6,157,585 A | * | 12/2000 | Kim | ........................ | 365/200 |
| 6,161,213 A | * | 12/2000 | Lofstrom | ....................... | 716/4 |
| 6,194,738 B1 | * | 2/2001 | Debenham et al. | ............ | 257/48 |
| 6,223,312 B1 | * | 4/2001 | Nozuyama | .................. | 714/724 |
| 6,446,017 B1 | * | 9/2002 | Skidmore | .................... | 702/81 |
| 6,456,554 B1 | * | 9/2002 | Gelsomini | .................. | 365/226 |
| 6,480,979 B1 | * | 11/2002 | Tomari | ....................... | 714/724 |
| 6,504,772 B2 | * | 1/2003 | Maeno | ........................ | 365/201 |
| 6,590,799 B1 | * | 7/2003 | Rickes et al. | ............... | 365/145 |
| 6,674,674 B2 | * | 1/2004 | Poechmueller | .............. | 365/200 |
| 2001/0022743 A1 | * | 9/2001 | Sato et al. | ............ | 365/189.03 |
| 2001/0055229 A1 | * | 12/2001 | Koike | ........................ | 365/200 |
| 2002/0031004 A1 | * | 3/2002 | Miyamoto | .................. | 365/145 |
| 2002/0097619 A1 | * | 7/2002 | Jacob et al. | ................ | 365/201 |
| 2003/0018937 A1 | * | 1/2003 | Athavale | ..................... | 714/724 |

* cited by examiner

*Primary Examiner*—Leo Picard
*Assistant Examiner*—Ryan A. Jarrett

(57) ABSTRACT

An integrated circuit (IC) chip contains a small non-volatile "ID" memory such as an FeRAM array that stores information associated with manufacturing, testing, and performance of the IC chip. The stored information can include but is not limited to a serial number, a wafer ID, a batch ID, a date code, chip history, test data, and performance information. The storing information on the chip eliminates any difficulty in matching the information with the IC chip and provides a flexible permanent record of any information the manufacturer may find useful. The ID memory thus permits tracking and identification of ICs to a degree that was not previously practical. Additionally, a self-test can compare prior test results stored in the ID memory to current self-test results to detect defects or to select operating parameters of the integrated circuit.

8 Claims, 1 Drawing Sheet

PERMANENT CHIP ID USING FERAM

BACKGROUND

Achieving a high yield of good integrated circuits is generally of critical importance to integrated circuit manufacturers. Accordingly, manufacturers often attempt to identify and address the cause of defects, when defects are detected. Tracking the batches or the particular wafers corresponding to defective chips can sometimes help identify the cause of defects. Accordingly, wafers are often marked with a unique ID or serial number that permits a manufacturer to keep a database containing the processing histories of the wafers.

Cutting a wafer separates the identifying marks from the resulting chips, so that tracking the source of a particular chip becomes very difficult after cutting. In particular, tracking individual chips can be done by marking the individual chips, which can be a time consuming additional processing step, and then maintaining a database indexed by the identifying marks on the chips. Chips might also be identified according to their position on processing equipment, but such identification is error prone.

Testing of the integrated circuits is also critical to quality control and to achieving a high yield of good IC chips. Accordingly, IC chips are generally subject to a series of quality control tests before and after packaging. Comparing the results of the separate tests can prove useful, but tracking and correlating the results of these tests presents the difficulty of identifying individual chips and then matching the chips with prior test results.

In view of the limitations of current techniques for identifying individual chips and matching data with specific chips, better structures and processes are sought for tracking of information associated with the manufacture of integrated circuits.

SUMMARY

In accordance with an aspect of the invention, an integrated circuit (IC) chip contains a small non-volatile "ID" memory such as an FeRAM array that stores information associated with the manufacturing, testing, and performance of the IC chip. The stored information for an IC chip can include but is not limited to a serial number, a wafer ID, a batch ID, a date code, chip history, test data, and performance information. The information being stored on the chip eliminates any difficulty in matching information with the IC chip and provides a flexible permanent record of any information the manufacturer may find useful. The ID memory thus permits tracking and identification of ICs to a degree that was not previously practical.

The ID memory can be used for life testing and quality control. In this application, the operation of the chip as measured in one test is compared to results from prior testing of the chip to corroborate performance or detect changes in the behavior of the chip. The integrated circuit itself can perform a self-test and compare the results from the self-test to stored test results to determine whether the integrated circuit is still performing as expected.

One embodiment of the invention is an integrated circuit that includes functional units and an ID memory in the integrated circuit. The functional units perform the normal functions of the integrated circuit, and the ID memory, preferably an FeRAM array, stores information associated with manufacture and testing of the integrated circuit. The stored information can include, but is not limited to, a batch identifier, a wafer identifier, a serial number, or test results.

The integrated circuit can further include mode selection logic that operates in a first mode to connect the functional units to external terminals (e.g., pins, solder bumps, or pads) and in a second mode to connect the ID memory to the terminals. To minimize pin count and simplify data accesses, information can be serially entered and read out, but I/O interfaces other than serial interface could also be used. Standard test equipment, which tests the ICs, can also access the ID memory to read stored information or to write initial or additional information.

Another embodiment of the invention is a manufacturing process for an integrated circuit. The process includes fabricating the integrated circuit to include a non-volatile memory that is accessible during the manufacturing process and then writing information into the memory during the manufacturing process. The information written can identify the integrated circuit or indicate test results. When testing detects a defect, information read from the integrated circuit can be used in determining a cause of the defect. Writing information to the memory can be performed before or after cutting the wafer to separate integrated circuit chips.

Yet another embodiment of the invention is a process that tests an integrated circuit and writes a result of the testing in a memory in the integrated circuit. The stored test result can be later read and compared to a result from the second test to corroborate the test results or observe aging effects.

DETAILED DESCRIPTION

In accordance with an aspect of the invention, an integrated circuit chip includes an ID memory that is an FeRAM array or other small non-volatile "ID" memory for storing information indicating the identity, history, and performance of the integrated circuit. Accordingly, even after the integrated circuit chip is separated from a wafer, the ID memory can be read to identify the batch, the wafer, the position of the chip on the wafer, or other identifying information for the chip. A manufacturer can easily track the origins of chips even after separation of chips from a wafer.

In accordance with a further aspect of the invention, the results from testing an integrated circuit before or after separation of the integrated circuit from a wafer are stored in the ID memory. The results can be read at any point and compared to other test results to observe aging effects or corroborate performance evaluations. Having test or performance data on the IC chip eliminates the need to physically track specific chips through the integrated circuit manufacturing process and simplifies matching test data with particular chips. Further, the stored test data can be used for comparisons during on-chip testing when the integrated circuit is in use.

Figure 1:
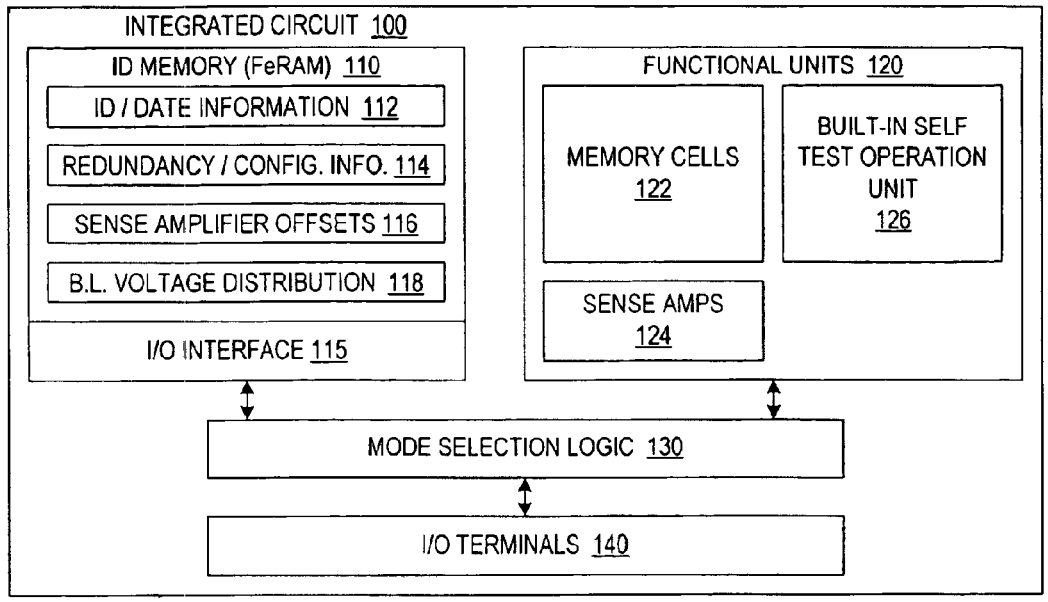
FIG. 1 is a block diagram of an integrated circuit chip containing an FeRAM for chip history.

FIG. 1 is a block diagram of an integrated circuit (IC) chip 100 that includes an ID memory 110. IC chip 100 can be any type of integrated circuit such as an ASIC, programmable logic, a microprocessor, a microcontroller, a DRAM, or an SRAM to name a few. Functional units 120 in IC chip 100 implement the normal functions of IC chip 100 and can have any design that may be developed for implementing those functions.

ID memory 110 stores information primarily associated with fabrication and testing of IC chip 100. In one embodiment, ID memory 110 is unnecessary and unrelated to the normal functions of IC chip 100. For example, if IC chip 100 is a processor or controller, ID memory 110 can be unnecessary and unrelated to the processing or control functions of IC chip 100, or if IC chip 100 is a memory such as a DRAM, SRAM, or FeRAM, ID memory can be separate from memory arrays that provide the normal data storage. Alternatively, functional units 120 may be connected to use ID memory 110 during normal operation (e.g., of units 122 and 124) and/or built-in self-test operations (e.g., of unit 126), and if the ID or test data is no longer required, functional units 120 can overwrite the ID and test data to use ID memory 110.

In a preferred embodiment of the invention ID memory 110 is an FeRAM array, which provides compact non-volatile storage of data. FeRAM array architectures employing single or dual ferroelectric capacitors in each FeRAM cell are well known in the art and suitable for ID memory 110. Alternatively, ID memory 110 can be constructed from other non-volatile semiconductor technologies, such as EPROM, EEPROM or FLASH memory. In general, the size of ID memory 110 will depend on the amount of information that a manufacturer wants to use in manufacture and testing of IC 100, but typically ID memory 110 ranges in storage capacity from a few tens of bits to several kilobits.

In the illustrated embodiment, ID memory 110 is accessible through mode selection logic 130 and I/O terminals 140. Depending on whether IC chip 100 is packaged or not, I/O terminals 140 can be pads on IC chip 100 or package connectors such as pins or solder bumps.

Mode selection logic 130 operates in a normal mode for normal operation of functional units 120 and in an ID mode in which mode selection logic 130 connects at least some of I/O terminals 140 for access to ID memory 110. The programming of a control register (not shown) for mode selection logic 130 or activation of specific input signals to I/O terminals 140 can select the mode. In a package where I/O terminals 140 are at a premium, sharing I/O terminals 140 through mode selection logic 130 allows access to ID memory 110 even after IC chip 100 is packaged. In an alternative embodiment of the invention, ID memory 110 has dedicated I/O pads, which can be connected or not connected to package terminals depending on whether access to ID memory 110 is desired after packaging.

ID memory 110 has an I/O interface 115, which preferably provides a simple access protocol such that conventional test equipment for integrated circuits can easily handle the control and data signals necessary for reading from and writing to ID memory 110. In an exemplary embodiment of the invention, I/O interface 115 for ID memory 110 is a parallel interface that reads or writes data to addresses in ID memory 110. In an embedded application, a parallel interface may be preferred since a parallel interface cuts down on programming/test time and because necessary internal buses are likely to already exist. However, a less complex I/O interface providing serial access and data transfer could also be employed.

Table 1 shows an example use of ID memory 110 when integrated circuit 100 is a 4 megabit FeRAM chip. The ID memory 110 of Table 1 includes fields that identify the chip 100 by product number, the process used for chip fabrication, a wafer lot number, a wafer number, and a chip position. Date and time information can also be included to indicate when particular processes or tests were performed. The identification and date information 112 for the chip 100 requires less than 100 bits of storage.

The ID memory 110 of Table 1 also includes a field for redundancy and/or configuration information 114 for the chip 100. Test equipment can write the redundancy or configuration information 114 to ID memory 110 when detecting a defect or measuring the performance of the chip 100. The use of the ID memory 110 for configuration or redundancy operations may avoid the need for laser fuse cutting or other additional processing steps that might otherwise be required.

The ID memory 110 of Table 1 includes further storage for test results. A test failure number or code identifying a failure may simply represent each test result using a minimum amount of storage. Alternatively, detailed test results for a 4-megabit FeRAM chip 100 can include such information as sense amplifier offsets 116 for all sense amplifiers 124 on the chip 100. The ID memory 110 can also store information indicating a distribution 118 of the bit line voltages read from the FeRAM cells 122 when all the FeRAM cells 122 store value "0" and a distribution of the readout bit line voltages when all the FeRAM cells 122 store value "1". Such detailed test information may require up to 4 kbits or more per test. The ID memory 110 can thus contain several 4-kbit sections for recording of the results from several tests. Even when storing test data from several tests, the size of the ID memory 110 remains a small fraction of the size of the 4-megabit storage in chip 100.

TABLE 1

| Field | Size |
| --- | --- |
| Product ID | 10 bits |
| Process ID | 6 bits |
| Wafer Lot ID | 16 bits |
| Wafer ID | 6 bits |
| Chip Position | 14 bits |
| Date/Time of Test or Process | 32 bits |
| Redundancy/Configuration | 64 bits |
| Test Data for Test 1 | 4 kbits |
| ... | |
| Test Data for Test 4 | 4 kbits |

Figure 2:
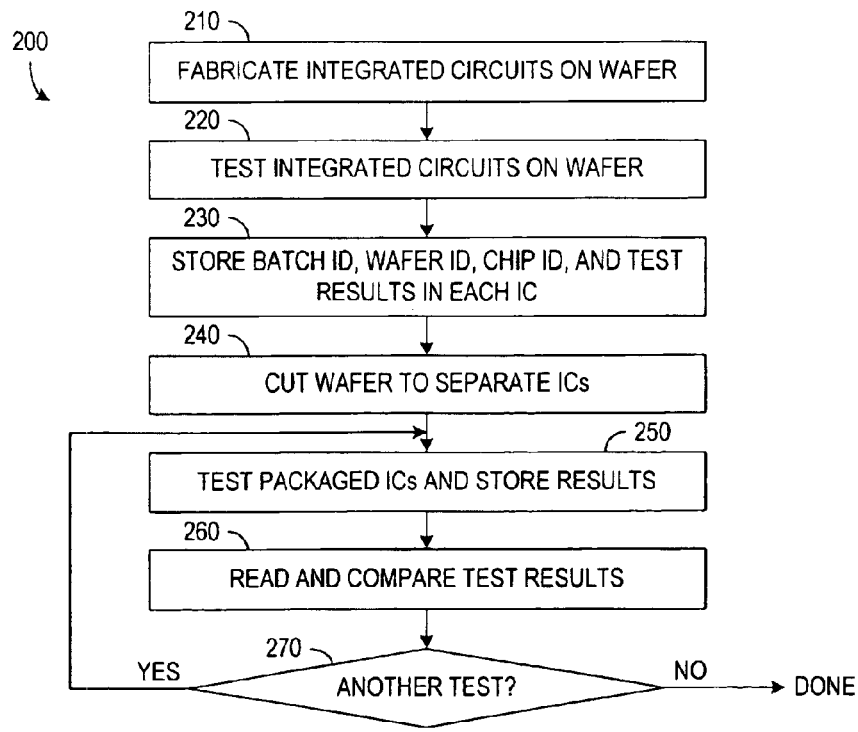
FIG. 2 is a flow diagram illustrating a process for manufacture and testing of an integrated circuit chip containing an FeRAM storing chip history.

FIG. 2 is a flow diagram of a fabrication and testing process 200 for an integrated circuit such as IC chip 100 of FIG. 1. Fabrication in process 200 begins with processing 210 a wafer to form multiple integrated circuits on a wafer. Before the wafer is cut to separate individual IC chips, standard test equipment can electrically contact pads of the ICs on the wafer and perform a test procedure 220. The test equipment is also capable as noted above of activating mode selection logic or otherwise accessing on-chip ID memory to store 230 identifying information such as a batch, wafer, and chip serial numbers. If storing 230 is after testing 220 as illustrated in FIG. 2, the test equipment can also store test results in the ID memory as during storing step 230.

A cutting process 240 cuts the wafer to separate individual IC chips. ID memories in the individual IC chips retain any identifying information written before cutting process 240 so that no special care is required to otherwise mark or keep the IC chips in a particular order. Further, storage of data in a separate database may not be necessary.

After cutting 240 of the wafer, standard test equipment can test 250 individual packaged IC chips and write test results in the ID memory, and the ID memory can be read 260 at any time to compare stored test results to other stored test results or to fresh test results that has not been stored in the ID memory. Additional testing, writing results, reading results, and comparing results can be performed before and/or after packaging the IC chip, until determining 270 that no further testing is required. Even after the IC chip is placed in use, a self-test or self-calibration operation can compare stored test results to results from a self-test to detect a defect or to select operating parameters of the integrated circuit.

The comparison of results illustrated in process 200 of FIG. 2 can corroborate measured performance of the IC chip or detect a defect. In the event that a defect is detected, information stored in the ID memory is available for identification of the cause of the IC chip and for analysis to determine a cause of the defects.

Although the invention has been described with reference to particular embodiments, the description is only an example of the invention's application and should not be taken as a limitation. For example, although the above embodiments store particular types of information related to IC manufacture and testing, the stored information is not limited to the types disclosed above but can instead be any type of data desired. As such, use of an ID memory permits tracking and identification of integrated circuits to a degree not previously practical. Further, although exemplary processes have been described with a particular order of steps, the order of such steps is generally subject to variation, and particular steps may be omitted entirely. Various other adaptations and combinations of features of the embodiments disclosed are within the scope of the invention as defined by the following claims.

What is claimed is:

1. An integrated circuit comprising:

functional units capable of performing normal functions of the integrated circuit, wherein the functional units of the integrated circuit include a memory array; and an ID memory comprising an FeRAM array that stores information associated with manufacture and testing of the integrated circuit, wherein the information comprises results from testing the integrated circuit, and the results from testing represent measured sense amplifier offsets of sense amplifiers on the integrated circuit.

2. The integrated circuit of claim 1, further comprising mode selection logic that is operable in a first mode in which the selection logic connects the functional units to terminals of the integrated circuit for the normal functions and in a second mode in which the selection logic connects the ID memory to the terminals to enable access to the ID memory.

3. A testing process for an integrated circuit comprising:

testing the integrated circuit;

writing in a memory in the integrated circuit information indicating a result of the testing; and performing a self-test on the integrated circuit, wherein the self-test compares the result in the memory to a result from the self-test, wherein the testing of the integrated circuit is performed during manufacture of the integrated circuit, and the self-test is performed during use of the integrated circuit.

4. The process of claim 3, wherein the memory is a ferroelectric memory.

5. The process of claim 3, wherein the self-test selects operating parameters of the integrated circuit.

6. A ferroelectric random access memory (FeRAM) comprising:

a first FeRAM array that provides the normal data storage; and an ID memory comprising a second FeRAM array that stores information indicating a distribution of bit line voltages read from the first FeRAM array, wherein the ID memory further stores measured sense amplifier offsets of sense amplifiers on the FeRAM.

7. The FeRAM of claim 6, further comprising mode selection logic that is operable in a first mode in which the selection logic connects the first FeRAM array to terminals and in a second mode in which the selection logic connects the ID memory to the terminals to enable access to the ID memory.

8. The FeRAM of claim 6, wherein the FeRAM performs a self-test and compares results from the self-test to information stored in the ID memory to determine whether the FeRAM is still performing as expected.

* * * * *